(12) United States Patent
Eklund et al.

(10) Patent No.: US 8,151,600 B2
(45) Date of Patent: Apr. 10, 2012

(54) SELF-INFLATED MICRO-GLASS BLOWING

(75) Inventors: Erik Jesper Eklund, Costa Mesa, CA (US); Andrei M Shkel, Irvine, CA (US)

(73) Assignee: The Regents of the University of California, Oakland, CA (US)

(*) Notice: Subject to any disclaimer, the term of this patent is extended or adjusted under 35 U.S.C. 154(b) by 638 days.

(21) Appl. No.: 12/113,927

(22) Filed: May 1, 2008

(65) Prior Publication Data
US 2008/0280124 A1 Nov. 13, 2008

Related U.S. Application Data

(60) Provisional application No. 60/915,904, filed on May 3, 2007.

(51) Int. Cl.
C03B 9/31 (2006.01)
C03B 19/08 (2006.01)
C03B 19/10 (2006.01)

(52) U.S. Cl. .......................................... 65/106; 264/544

(58) Field of Classification Search .................. 65/106; 264/46.8, 46.4; 156/77; 428/315.9; 425/112; 216/92
See application file for complete search history.

(56) References Cited

U.S. PATENT DOCUMENTS 5,164,558 A * 11/1992 Huff et al. .................... 200/83 R
5,399,415 A * 3/1995 Chen et al. .................... 428/209

OTHER PUBLICATIONS

Eklund and Shkel, "Glass Blowing on a Wafer Level", Journal of Microelectromechanical Systems, vol. 16, No. 2, Apr. 2007.*
Eklund et al., "Spherical Rubidium Vapor Cells Fabricated by Micro Glass Blowing", MEMS 2007, Kobe, Japan, Jan. 2007.*
Huff et al., "Design of Sealed Cavity Microstructures Formed by Silicon Wafer Bonding", Journal of Microelectromechanical Systems, vol. 2, No. 2, Jun. 1993.*
Liew et al., "Microfabricated Alkali Atom Vapor Cells", Applied Physics Letters, vol. 84, No. 14, Apr. 5, 2004.*
Eklund, "Glass Blowing on a Wafer Level," Journal of Microelectromechanical Systems, Apr. 2007, vol. 16, No. 2.
Eklund, "Spherical Rubidium Vapor Cells Fabricated by Micro Glass Blowing," MEMS 2007, Jan. 2007, Kobe, Japan.

* cited by examiner

Primary Examiner — Matthew Daniels
Assistant Examiner — Cynthia Szewczyk
(74) Attorney, Agent, or Firm — Marcus C. Dawes; Daniel L. Dawes

(57) ABSTRACT

A method for glass-blowing on a microscopic level includes the steps of defining a plurality of microholes in a wafer, disposing a sheet of thermally formable material onto the wafer covering the microholes, heating the sheet of thermally formable material until a predetermined degree of plasticity is achieved, applying self-induced fluidic pressure by expansion of the heated trapped gas in the microholes to the sheet of thermally formable material, while the sheet is still plastic, and simultaneously forming a plurality of blown micro-objects in the sheet on the wafer by means of continued application of pressure for a predetermined time.

20 Claims, 14 Drawing Sheets

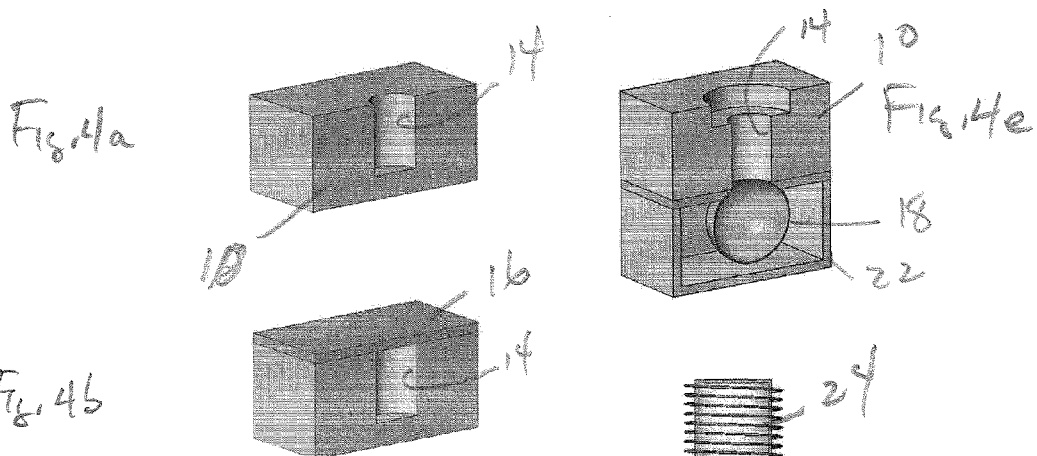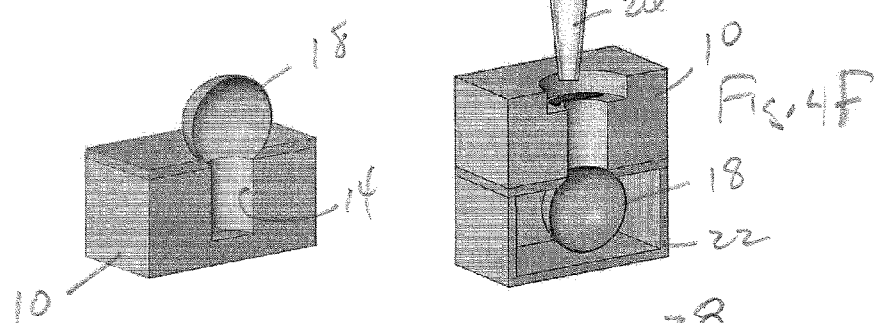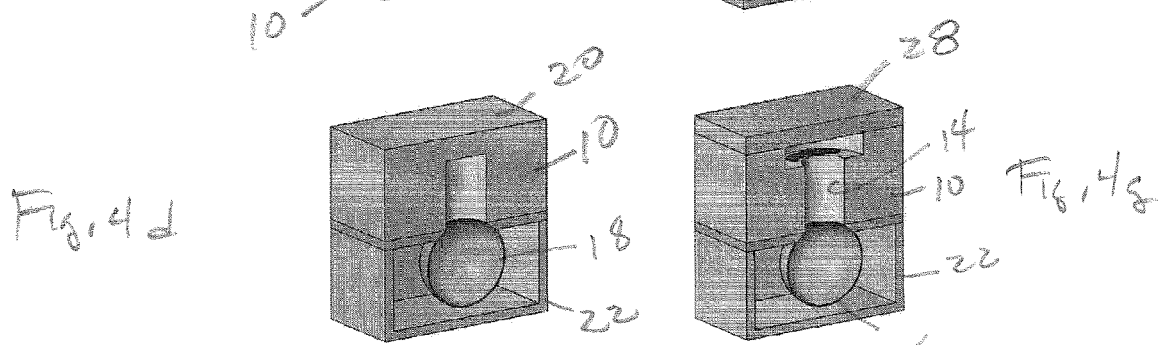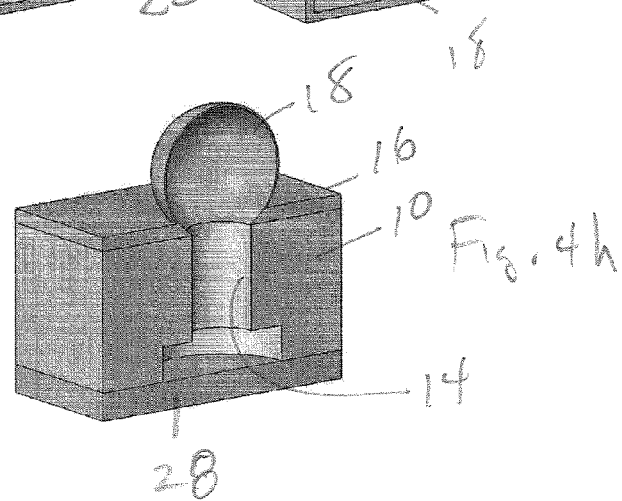

SELF-INFLATED MICRO-GLASS BLOWING

RELATED APPLICATIONS

The present application is related to U.S. Provisional Patent Application Ser. No. 60/915,904, filed on May 3, 2007, which is incorporated herein by reference and to which priority is claimed pursuant to 35 USC 119.

BACKGROUND OF THE INVENTION

1. Field of the Invention

The invention relates to a method for shaping glass on a microscopic scale utilizing self-inflation.

2. Description of the Prior Art

Glass blowing is an art that dates back over 2000 years. Today, glass blowing is used in a wide array of applications, including scientific glassware, optical components, consumer glass containers, and visual arts. Although blow-molding techniques are used in the glass industry to automate the fabrication of bottles and other containers, many fine glass products are still shaped one at a time by glass blowers.

The property that enables the successful shaping of glass is that its viscosity is highly dependent on the temperature. In order to shape glass it needs to be heated above its softening point, i.e., the temperature at which glass has a viscosity of $10^{6.6}$ Pascal-seconds (Pa-s) (about 800° C. for borosilicate glass). In conventional glass blowing, a gob of glass is first heated inside a furnace. The gob is then removed from the furnace and blown into desired shapes. Often the heating and blowing steps are repeated multiple times. Once the glass is shaped, it is usually annealed to remove stresses that developed during the blowing. The original implementation of micro-glass blowing was a direct adaptation of conventional glass blowing techniques on a microscale, i.e., to bond a glass wafer to a through-etched silicon wafer, heat the bonded wafers, and directly apply fluidic pressure through the etched holes in order to blow spheres—described in US Patent Application Publication 2007/0071922.

Microspheres have been fabricated in the past using different fabrication methods. For example, see: R. Cook, "Creating Microsphere Targets for Inertial Confinement Fusion Experiments", Energy & Technology Review, pp. 1-9, April 1995; R. Dagani, "Microspheres Play Role in Medical, Sensor, Energy, Space Technologies", Chemical and Engineering News, pp. 33-35, December 1994. However, previously fabricated microspheres are not attached to a substrate and can only be filled with certain light gases (e.g. hydrogen) through diffusion.

BRIEF SUMMARY OF THE INVENTION

Glass blowing techniques can normally only be used on a macroscopic scale, and the glass products have to be shaped one at a time. We here disclose and demonstrate how multiple micro-glass-spheres can be formed simultaneously on a silicon substrate. A thin sheet of glass is first bonded to an etched wafer. The sample is then heated inside a furnace above the softening point of glass, and due to the expansion of the trapped gas the glass is blown into spherical shapes. Other alternative ways of shaping the glass are also included with the scope and spirit of the invention. The capability to blow glass on a wafer level enables several applications, e.g. microlenses and small gas confinement chambers. Potentially this technology can also be used for drug delivery and diagnostic devices, as well as other biomedical applications. It must be understood that the term "wafer" is or can be used interchangeably with the term "chip" throughout this specification as appropriate. In general, a wafer may include a multiplicity of chips or be diced into separate chips. A chip may also include a plurality of spheres and need not be a considered as restricted to carrying a single sphere or micro-object included on it. Additionally, while spherical shapes are considered for illustrative purposes, non-spherical shapes can also be fabricated by applying blowmolding techniques. Furthermore, cylindrical (in-plane) micro-glass channels can be achieved by defining narrow etched trenches in the silicon wafer.

Thus, the illustrated embodiment is particularly directed to glass blowing on a microscopic level, glass blowing compatible with microfabrication technologies, glass blowing on a wafer level, a method for fabricating microspheres or other micro-glass shapes, simultaneous manufacturing of numerous micro-structures on a chip, an ability to simultaneously fill multiple glass shells with gases and other substances This disclosure introduces fabrication processes where glass is blown on a wafer level allowing thousands of glass parts to be built simultaneously. The presented micro glass blowing also opens opportunities for integration with electrical and mechanical components on a chip using conventional microfabrication techniques. The illustrated embodiment of the fabrication process was developed for a micromachined implementation of a nuclear magnetic resonance gyroscope (NMRG), where a spherical gas confinement chamber is preferred in order to minimize the self-magnetization of the atoms. Although no previous micro-NMRGs have been reported, large NMRGs built around traditionally blown glass spheres have been demonstrated in the past.

Many other novel applications may be enabled by this new fabrication technique, including microscopic spherical gas confinement chambers, complex three-dimensional microfluidic networks for gas analyzers or miniature drug delivery systems, spacers and hermetic enclosures for wafer-level packaging, micro discharge lamps and plasma light sources, and micro-optical components (e.g. mass-produced microscopic glass lenses).

The illustrated embodiments thus include a method for glass-blowing on a microscopic level comprising the steps of defining a plurality of blind microholes in a wafer; disposing a sheet of thermally formable material onto the wafer covering the microholes to trap a gas in the microholes; heating the sheet of thermally formable material until a predetermined degree of plasticity is achieved; applying thermally generated pressure arising from the thermal expansion of the trapped gas in the microholes to the sheet of thermally formable material, while the sheet of glass is plastic; and simultaneously forming a plurality of blown micro-objects in the sheet on the wafer by means of continued application of thermally generated pressure for a predetermined time.

The step of defining the microholes comprises etching the microholes using deep-reactive ion etching (DRIE). However, it must be understood that the microholes may be made using any methodology now known or later devised, such as etching by either wet or dry etchants, micromechanical drilling, laser etching, microelectromachining and the like.

The step of defining the microholes comprises etching the microholes using wet etchants.

The step of defining the microholes comprises etching the microholes using any currently known or future discovered means of etching.

The step of disposing a sheet of thermally formable material comprises bonding the thermally formable material to the wafer using anodic bonding to seal the plurality of microholes.

The step of disposing a sheet of thermally formable material comprises bonding the thermally formable material to the wafer using any bonding methods currently known or future discovered.

The step of disposing a sheet of thermally formable material comprises bonding borosilicate glass to the wafer.

The step of disposing a sheet of thermally formable material comprises bonding the thermally formable material inside a controlled pressure environment so that the volume of the corresponding micro-object formed by the thermally generated pressure can be accurately controlled.

The illustrated embodiments of the method further comprises the step of fabricating integrated electrical and mechanical components on or into the wafer.

The illustrated embodiments of the method further comprises the step of disposing a gas-source material in a solid state in the micro-objects and heating the gas-source material to produce a vapor inside the micro-objects.

The illustrated embodiments of the method further comprises the step of sealing the micro-objects by bonding a layer to the backside of the wafer.

The step of simultaneously forming a plurality of blown micro-objects in the sheet on the wafer by means of continued application of pressure for a predetermined time comprises blowmolding the micro-objects into a mold.

The step of simultaneously forming a plurality of blown micro-objects in the sheet on the wafer by means of continued application of pressure for a predetermined time comprises controlling the pressure of the surrounding environment so that the volume of the corresponding micro-object formed by the thermally generated pressure can be accurately controlled.

The step of simultaneously forming a plurality of blown micro-objects in the sheet on the wafer by means of continued application of pressure for a predetermined time comprises forming a hollow substantially spherical micro-object or hemispherical micro-object.

The step of simultaneously forming a plurality of blown micro-objects in the sheet on the wafer by means of continued application of pressure for a predetermined time comprises forming hollow substantially cylindrical micro-channels.

The step of defining the plurality of blind microholes into the wafer further comprises defining an enlarged volume chamber within each blind microhole so that the corresponding micro-object formed by the thermally generated pressure is increased in volume as compared to the micro-object formed by the thermally generated pressure in the corresponding microhole without the enlarged chamber formed therein.

Each microhole has an opening adjacent to the sheet communicating with an interior of the micro-object when the micro-object is formed. The opening has a reduced diameter $r_0$ compared to remaining portions of the microhole such that sphericity of the micro-object formed in the sheet as determined by the ratio of the height of the micro-object to its radius tends toward 1. The reduced diameter opening is of the order of a few microns.

In one embodiment the wafer is comprised of two layers bonded together, namely a top layer having the microholes defined therethrough with the reduced diameter opening and a bottom layer having blind microholes defined therein with a larger diameter than the opening aligned with the microholes in the top layer, and where disposing the sheet of thermally formable material onto the wafer covering the microholes to trap a gas in the microholes comprises disposing the sheet of thermally formable material onto the top layer.

The illustrated embodiment includes an apparatus in which some of the foregoing embodiments of the method is practiced.

The illustrated embodiment further includes the fabricated micro-objects which are made from some of the foregoing embodiments of the method.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIGS. 4a-4h is a diagram of the steps of a method wherein micro-objects are thermally self-inflated or blown and then later filled with an alkali, gas and/or other substance.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The illustrated embodiments of the invention disclosed below provide a way of simultaneously forming multiple microscopic glass components on a wafer. These glass-structures are orders of magnitude smaller than what can be achieved using traditional glass blowing techniques. In the illustrated embodiment, the glass spheres are attached to a wafer, allowing for integration with traditional micro-fabrication techniques. Furthermore, the glass structures can be filled with gaseous, liquid, and/or solid materials post fabrication.

The illustrated embodiment of the invention satisfies the need to implement a microscopic gas confinement chamber. Many specific applications for such a chamber can be considered, e.g. nuclear magnetic resonance gyroscopes, micro-lamps, and hydrogen capsules for H-vehicles. Other possible applications include micro-lenses, optical switches, laser fusion targets, magnetic shielding when a shielding material is applied on the inside/outside of the sphere, as well as lab-on-a-chip, drug delivery systems, medication capsules, and other biomedical devices.

Figure 1A:
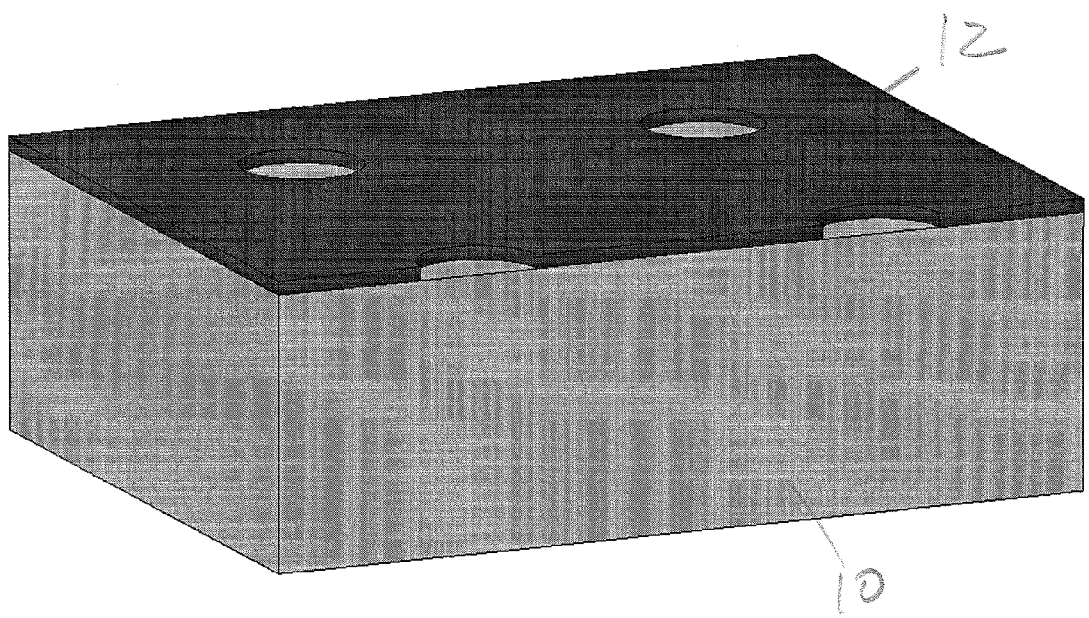
FIGS. 1a-1e is a diagram of the steps of a method wherein micro-objects are made without the assistance of external blowing or pressure, but are thermally self-inflated or blown.
Figure 1B:
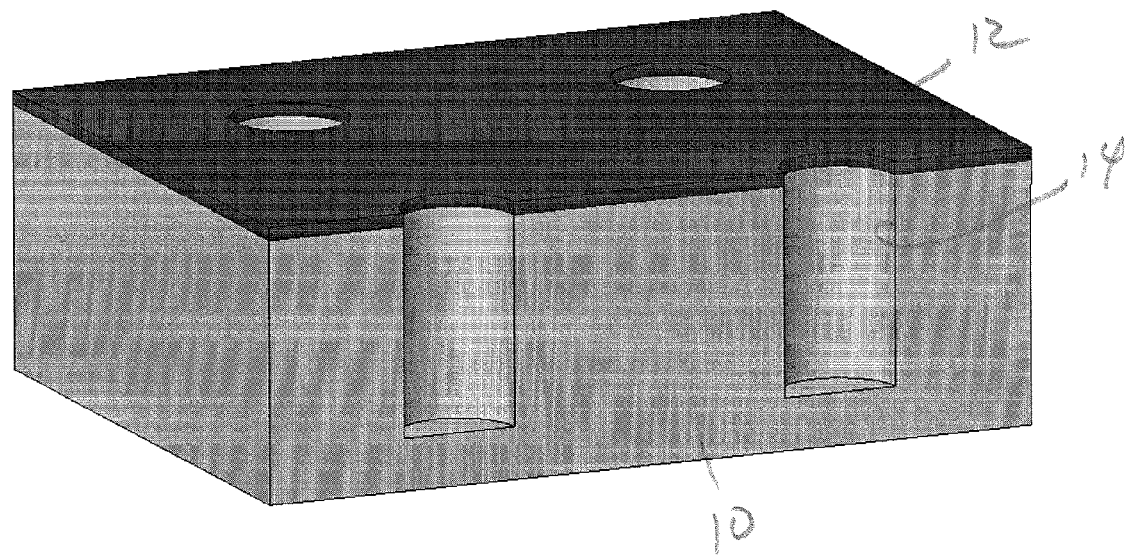
Figure 1C:
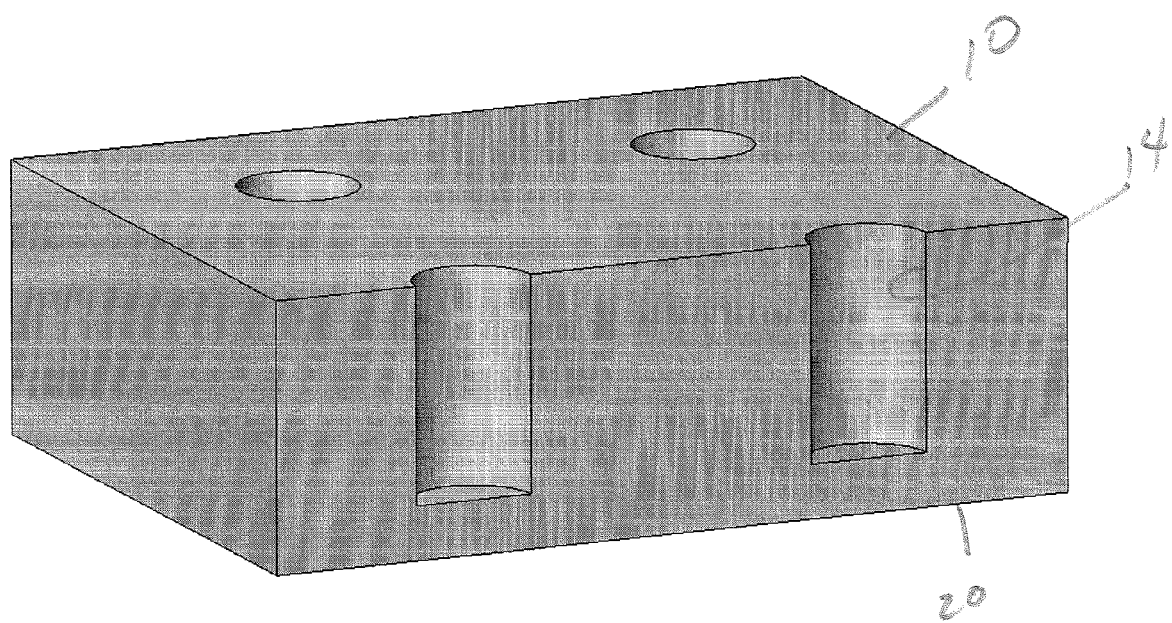
Figure 1D:
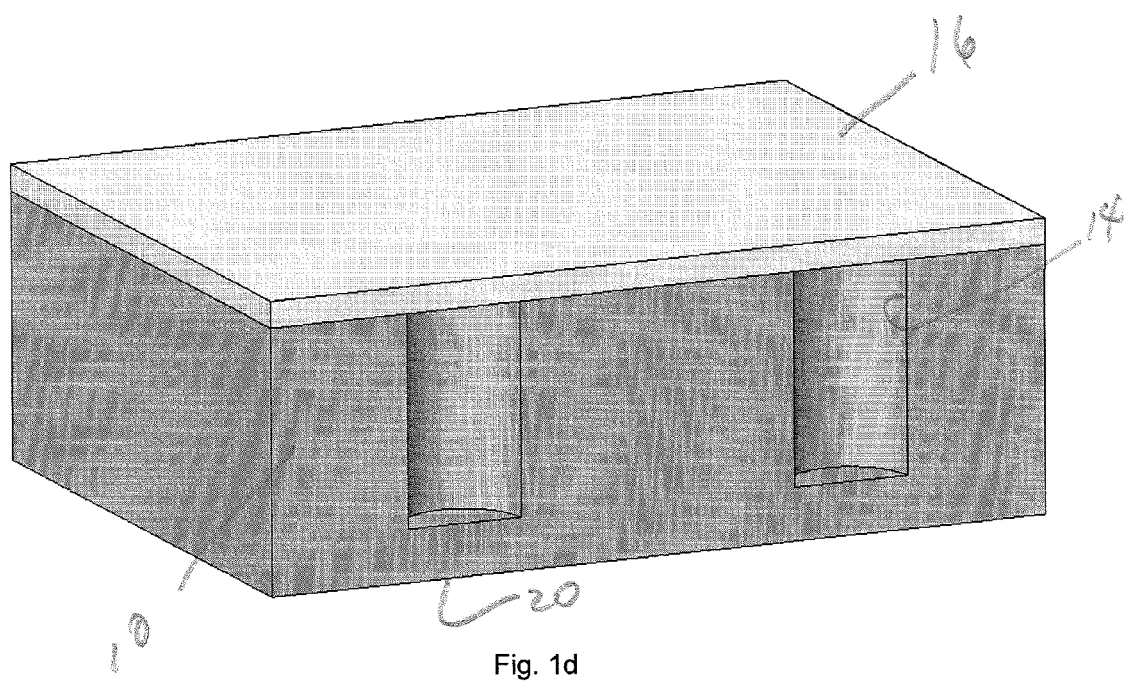
Figure 1E:
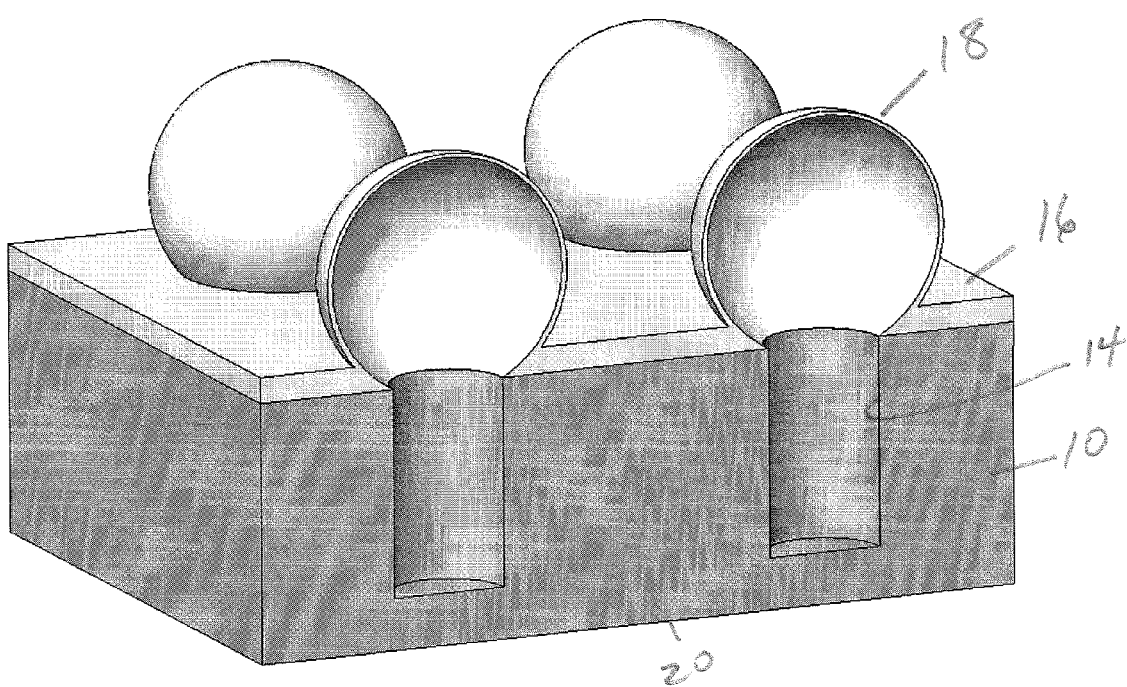

In the preferred fabrication process as depicted in FIGS. 1a-1e a silicon wafer 10 is first patterned with a layer of AZ4620 photoresist 12. Cylindrical cavities 14 are then etched in the wafer using deep-reactive ion etching (DRIE). The photoresist 12 is removed with acetone and a thin sheet of borosilicate glass 16 (e.g. Pyrex 7740) is anodically bonded to the top surface of wafer 10, covering the openings to etched cavities 14. Once bonded, the glass 16 may also be ground and polished if thinner cross sections or particular surface finishes are desired. Next the glass covered wafer 10 of FIG. 1d is placed inside a furnace at a temperature above the softening point of the glass 16. Since the pressure inside the sealed cavities 14 increases when the wafer 10 is heated, the glass 16 will deform into spherical shapes 18, as illustrated in FIG. 1e.

Once the glass 16 is shaped, the backside 20 of the wafer 10 can be etched as shown in FIG. 4e described below to allow for filling of various gases or other substances into spheres 18. The backside 20 can then be resealed using conventional wafer bonding techniques. Etching of the backside 20 is also necessary if the process is used for creating micro-lenses, although the backside would naturally not be resealed in this case since an optical path would be needed between the two sides of the lens.

The fabrication method illustrated in FIGS. 1a-1d constitute the foundation of the micro glass blowing process and define the shape and size of the glass structures 18. While these steps are usually included in the fabrication process, additional steps can be added as needed to suit a particular application. For many applications, e.g. micro-lenses and gas confinement chambers, it is necessary to etch the backside of the silicon wafer 10 after the glass spheres 18 have been formed. For example, FIGS. 4a-4h illustrate how a gas confinement chamber can be fabricated by etching the backside of the silicon wafer 10 in order to be able to fill the glass sphere 18 with an alkali metal and/or buffer gas. The steps illustrated in FIGS. 4a-4c are the same as those in FIGS. 1c-1e respectively (the steps in 1a-1b were omitted from this illustration, but would be included in the actual fabrication). In the step illustrated in FIG. 4d, the wafer 10 is placed in a temporary holder 22 in order to protect the glass spheres 18. The backside 20 is then patterned and etched in the step FIG. 4e, using for example DRIE. For illustrative purposes, a filling technique similar to that described in S. Knappe, et al., Opt. Lett. 30 (2005) 2351-2353 is used. It is to be understood that any filing technique now known or later devised could be substituted. $BaN_6$ and $^{87}RbCl$ are placed inside a small glass ampoule 24 with a 5 mm long nozzle 26 of 700 μm diameter. The wafer 10 with the glass-blown cell or sphere 18 is placed inside a vacuum chamber and the ampoule 24 is aligned with the opening 14. Next, the ampoule 24 is heated in order to react the compounds, as shown in the step FIG. 4f of the fabrication process. Since the vapor pressure of rubidium is higher than that of Ba and Cl, a fairly pure beam of $^{87}Rb$ emerges from the ampoule 24 and is deposited into the sphere 18. The nitrogen produced during the reaction is pumped away. The vacuum chamber inside which the filling is performed (not shown) is then filled with the desired combination of buffer gases, here a mixture consisting of Xe in natural isotopic abundance and $N_2$. The backside 20 is then sealed by anodic bonding of a glass wafer or sheet 28 in the step of FIG. 4g. Finally, the wafer 10 is taken out from the vacuum chamber and the temporary holder 22 is removed from the wafer 10 as shown in the step of FIG. 4h. The materials used to fill sphere 18 have been described here only for the purposes of illustration and it is to be expressly understood that any materials and gases may be substituted as desired.

One alternative option is to fill the cavities 14 with the desired substances before the glass 16 is bonded in the step of FIG. 1d (or FIG. 4b). If this is done, the etch, filling, and resealing steps in FIGS. 4d-4g would not be required. However, certain light gases may diffuse through the glass 16 when the glass covered wafer 10 is heated inside a furnace. Furthermore, some substances may vaporize and Increase the pressure Inside the etched cavity 14 more than desired. For certain substances, an additional filling step (before the step of FIG. 1d) is a preferred option instead of filling cavities 14 and spheres 18 from the back with substances post-fabrication.

Another embodiment of the process is to etch non-cylindrical cavities in the wafer. For example, if a trench of substantial length (not shown) is etched in the wafer and the thermally formable material is subsequently bonded and shaped by the thermally generated pressure, the micro-structure 18' would assume the shape of a cylindrical channel with its axial direction parallel to the wafer plane (or out-of-plane relative the sketch in FIG. 3). By defining a network of connecting trenches in the wafer, a complex three-dimensional network of micro-glass channels can be obtained.

Yet another embodiment of the process is to use a mold to shape non-spherical structures 18'. For example, a wafer with predefined etched cavities (e.g. cubical molds) can be temporarily attached on top of the glass before the step in FIG. 1e. After the blowing in step in FIG. 1e, hollow cubical glass structures 18' would now be obtained instead of hollow semi-spheres (not shown). Many other types of glass shapes can be made by employing this molding principle similar to conventional blow molding at macroscopic scales.

Using the processes in the above embodiments, multiple glass structures 18 can be batch fabricated simultaneously. The fabrication process also allows for potential integration of other electrical and mechanical components on the wafer 10 using conventional microfabrication techniques. If the wafer 10 needs to be diced, some care needs to be taken to assure that the glass 18 is not damaged. Several methods can be employed for this purpose, e.g. covering the wafer 10 with wax before the dicing. The wax can then be removed by heating the sample in a water bath. Alternatively the dicing can be performed before the glass is blown (between the steps in FIGS. 1d and 1e). As was illustrated in the fabrication processes disclosed above, no external blowing needs to be involved in the fabrication of the glass spheres 18 although it may be included. Instead, the glass components 18 can be formed by themselves due to the increased pressure inside the sealed cavities 14, which is understood to include the volume within the glass component 18, when heated. An estimate of the pressure that develops inside the cavity can be obtained from the ideal gas law $$PV = nRT \quad (1)$$

where P is the pressure, V is the volume, n is the number of moles, R is the Boltzmann constant, and T is the temperature. Since n and R are both constants, the ideal gas law can also be written as $P_1V_1/T_1 = P_2V_2/T_2$.

An estimate of the pressure that develops inside the cavity 14 before the glass 16 is deformed can be obtained from the ideal gas law (for constant volume): $P = P_iT_f/T_i$ where $T_f$ is the final temperature, $T_i$ is the initial temperature, and $P_i$ is the initial pressure. For example, inside a container that is initially at room temperature and atmospheric pressure, and is then heated to 1200 K, the pressure will increase to four atmospheres.

Figure 2A:
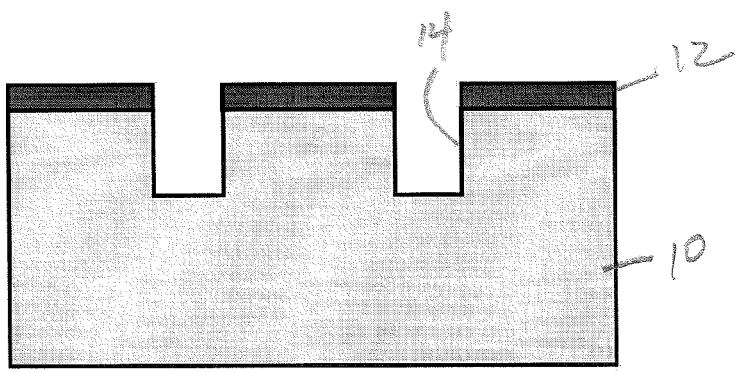
FIGS. 2a-2d is a diagram of the steps of a method to fabricate micro-objects in which larger or highly spherical shapes can be made.
Figure 2B:
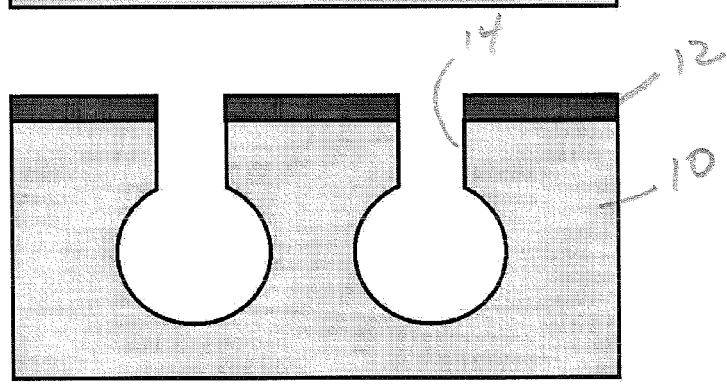
Figure 2C:
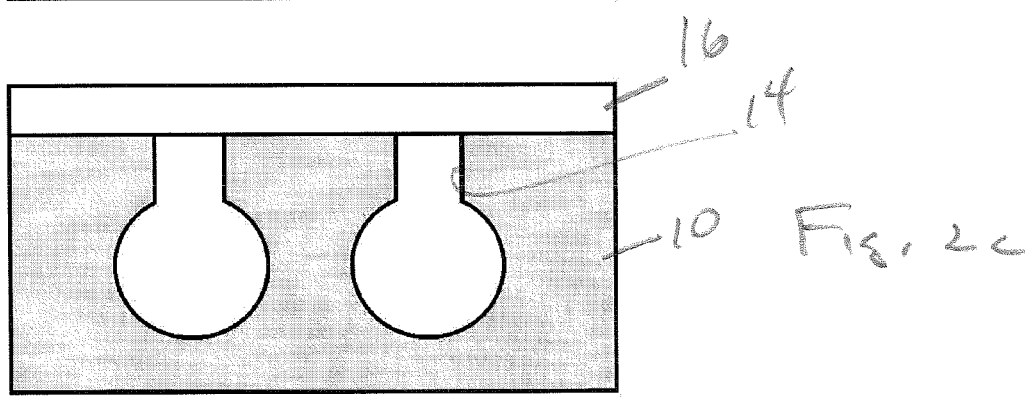
Figure 2D:
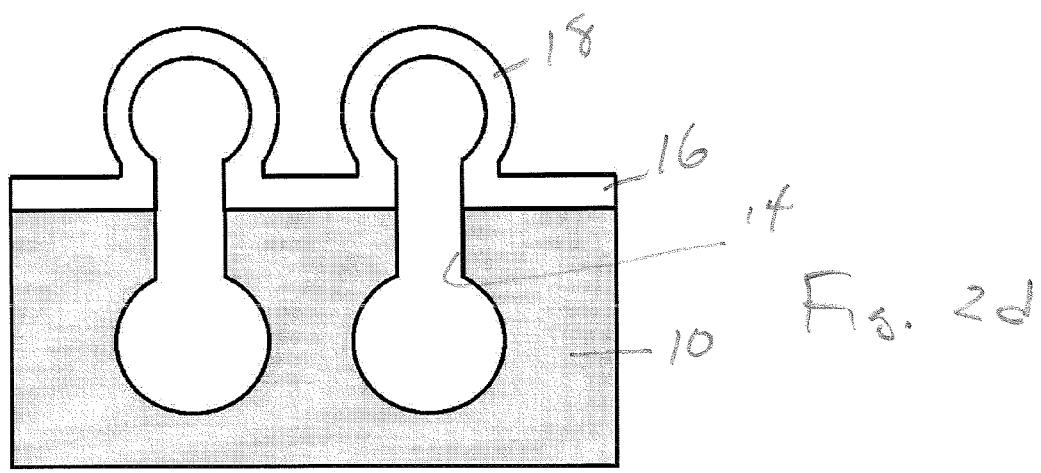
Figure 7:
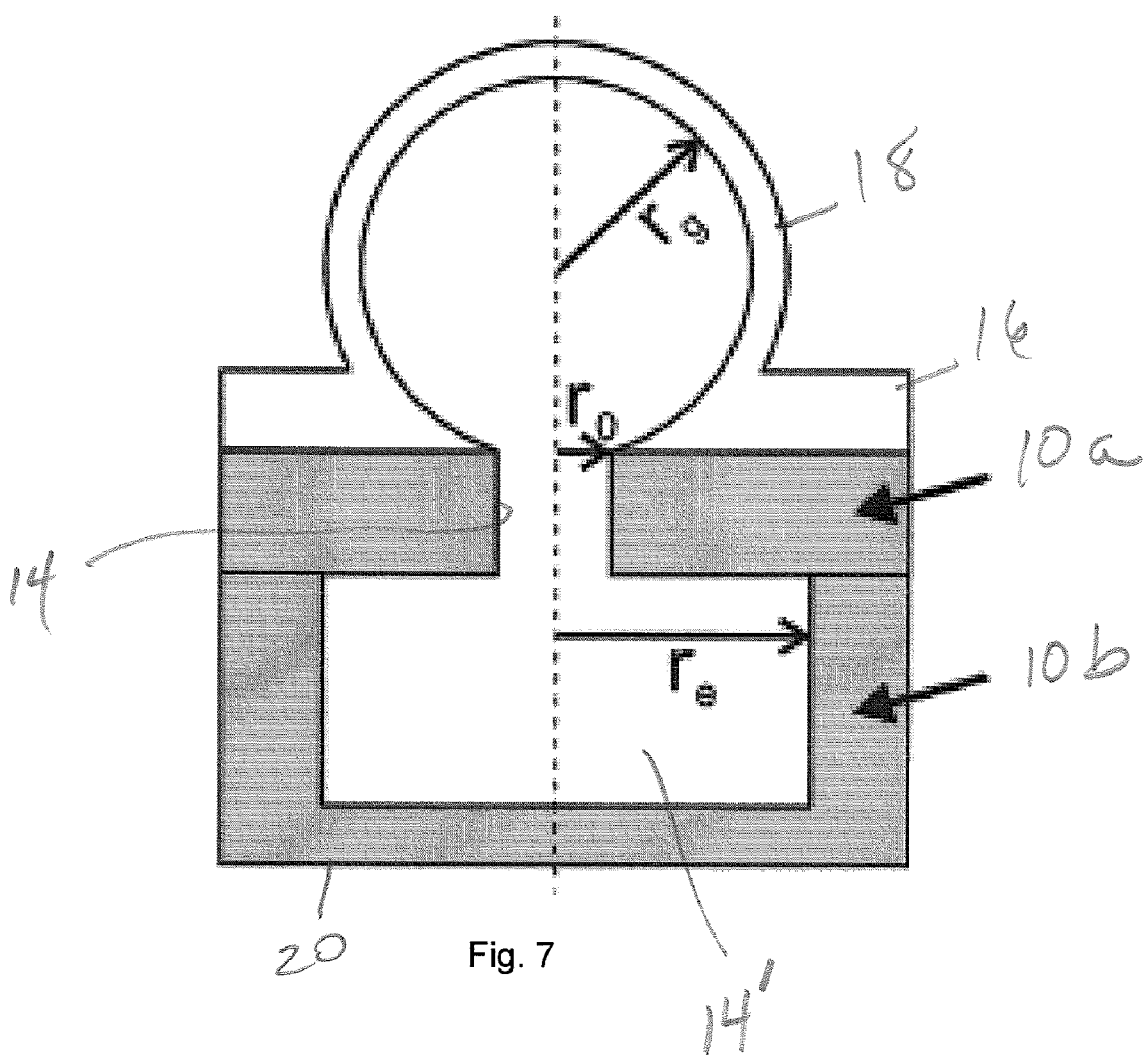
FIG. 7 is a diagram of an embodiment wherein two wafers are employed to fabricate a substantially spherical micro-object with a size and volume that can be defined independently of the radius of the undeformed membrane, $r_0$.

In order to control the size of the glass shapes, the pressure inside the sealed chambers 14 needs to be controlled. Large shapes may be obtained by either increasing the pressure or increasing the volume of the etched cavity 14. While it is also possible to increase the temperature at which the glass shapes are formed, the range of usable temperatures is pretty narrow since the temperature needs to be just slightly above the softening point of glass. Thus, the pressure and volume of the etched cavity will affect the size of the shapes to a greater extent than the temperature. If a larger cavity 14 is etched, a larger glass bubble 18 can be blown due to the ideal gas law at an elevated but constant temperature when the glass volume begins to expand: $V = V_{etched} P_i/P_f$ where V is the total volume enclosed by both the etched cavity and the deformed glass, $V_{etched}$ is the volume of the etched cavity only, $P_i$ is the initial pressure at an elevated temperature (just before the glass starts to deform), and $P_f$ is the final pressure once the bubble has been blown (~1 atm if the self-inflation of the glass is performed in a furnace at atmospheric pressure). Making wafers 10 thicker and etching deeper cavities 14 is one way of achieving larger glass spheres. Alternatively the wafer 10 may be heated inside a vacuum furnace in order to amplify the pressure difference between the inside and outside of the etched cavity 14 by decreasing $P_f$. Another option is to perform the anodic bonding inside a pressurized chamber, allowing precise control over $P_i$. Yet another option is to fill the cavity 14 with a substance that vaporizes and increases the pressure inside the cavity 14 (i.e. increase $P_i$). Yet another mode to increase the volume of the etched cavity 14 is to use a 2-step DRIE process as illustrated in FIGS. 2a-2d. After the initial DRIE etch in FIG. 2a, the sidewalls are passivated and coated with a masking material. In FIG. 2b the bottom of the cavities are then etched using either a dry or wet etchant. This will increase the etched volume for a certain depth, and thus enable the blowing of larger structures. Yet another alternative allowing for increased volume of the blown glass is shown in FIG. 7. Here two silicon wafers have been bonded (before the glass was bonded). The first wafer now defines the "base" of the sphere, and the second wafer defines the volume ($V_{etched}$).

The principles of the glass blowing processes described above are based on the free inflation and large deformation of an initially flat glass sheet at elevated temperatures. Thus, the modeling is related to that of biaxial inflation of viscoelastic membranes, commonly used for material characterization in the polymer industry. A few assumptions are made regarding the glass in order to model the fabrication process. At room temperature glass essentially behaves like an elastic solid, responding rapidly to applied stress. However at sufficiently high temperatures, stress is immediately relieved from the material due to the low viscosity of the glass. At high temperatures (and consequently low viscosities) glass can be modeled as a Newtonian fluid. Glass also has a viscoelastic region for viscosities between approximately $10^8$ Pa-s and $10^{13}$ Pa-s. In the fabrication processes described in the illustrated embodiments, the glass is shaped at temperatures between 850 and 900° C. The viscosity in this temperature region is less than $10^6$ Pa-s for borosilicate glass. It is therefore assumed in the following that the glass can be modeled as an incompressible Newtonian fluid due to the low viscosity at the elevated temperatures.

In the illustrated embodiments the glass blowing takes place inside a furnace at atmospheric pressure, although this need not be required in all embodiments. When the wafers 10 are placed inside the furnace, the high temperature will cause the pressure to increase rapidly inside the sealed cavities 14 of the silicon wafer 10. At the same time the viscosity of the glass 16 decreases and the glass sheet 16 starts to deform. The glass 16 will grow into a spherical shape due to the uniform pressure distribution. After a sufficiently long period of time the pressure inside the glass shells, hemispheres or spheres 18 will be almost equal to the atmospheric pressure inside the furnace and most of the stresses in the glass shells 18 will be relieved. Since the final pressure is approximately equal on the inside and the outside of the hollow semisphere 18 and the cavities 14 were sealed at atmospheric pressure, the ideal gas law yields the following relation between the initial volume $V_e$ of the etched cavity 14, and the volume of the blown glass shell 18, $$V_g = V_e \left( \frac{T_f}{T_s} - 1 \right) \quad (2)$$

where $T_f$ is the furnace temperature and $T_s$ is the temperature at which the cavities 14 etched in the silicon wafer 10 were sealed by the glass wafer 10. Note that this equation only holds true in the illustrated embodiment when the etched cavities are sealed at the same pressure as the pressure inside the furnace in which the shaping of the glass is performed (here 1 atm). As was previously discussed, the bonding and/or furnace pressures may alternatively be individually controlled in order to provide better control over the size and volume of the glass structures. In this case the complete ideal gas law has to be considered: $P_s V_e / T_s = P_f (V_e + V_g) / T_f$, where $P_s$ and $P_f$ are the pressure at which the etched cavities are sealed and the pressure at which the glass structures are shaped (e.g. inside a furnace), respectively.

Figure 3:
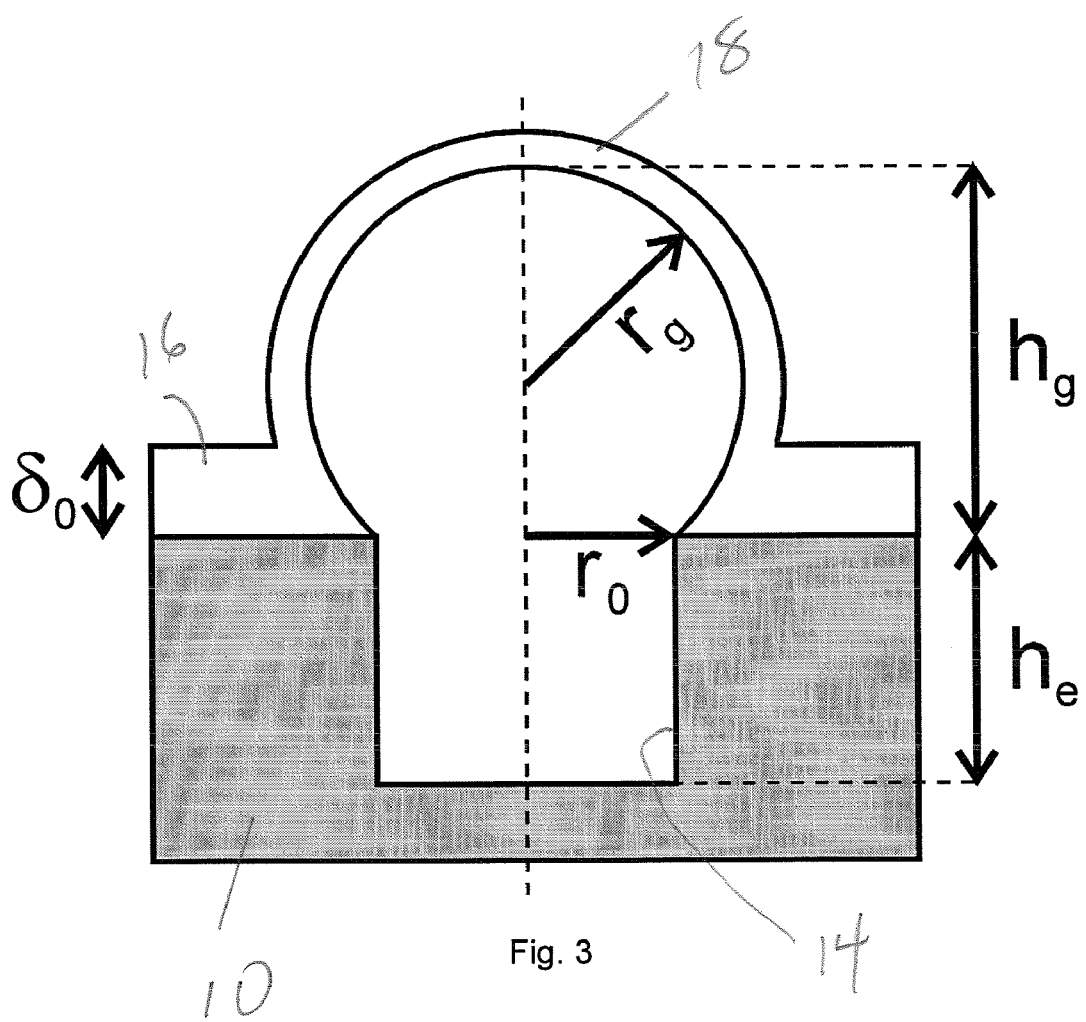
FIG. 3 is a cross-sectional diagram of a substantially hemispherical micro-object fabricated with a wafer according to the invention.

From geometry considerations, the radius of curvature of the hollow glass semisphere 18 develops according to $$r_g = \frac{h_g^2 + r_0^2}{2h_g} \quad (3)$$

where $h_g$ is the height of the glass semisphere 18 and it is assumed that the undeformed membrane was circular with a radius of $r_0$. Note that the height of the glass 16 is measured from the bottom of the undeformed glass sheet 16 to the interior wall of the top of the blown glass shell 18, as illustrated in FIG. 3.

By considering the ratio between the volume of the undeformed glass membrane, $\pi r_0^2 \delta_0$, and the approximate final volume of the glass shell 18, $2\pi r_g h_g \delta$, and assuming that the glass 16 is incompressible, the thickness of the hollow semisphere 18 can be estimated as $$\delta = \frac{r_0^2 \delta_0}{r_0^2 + h_g^2} \quad (4)$$

where $\delta_0$ is the initial thickness before the deformation. However, in reality the thickness will vary slightly over the surface of the shell 18 with the smallest thickness at the top.

In the process that was illustrated in FIGS. 1a-1e the etched cavity 14 is cylindrical and the blown glass shell 18 is spherical. Thus, their respective enclosed volumes are $$V_e = \pi r_0^2 h_e \quad (5)$$

and $$V_g = \frac{\pi}{3} h_g^2 (3 r_g - h_g). \quad (6)$$

Figure 5:
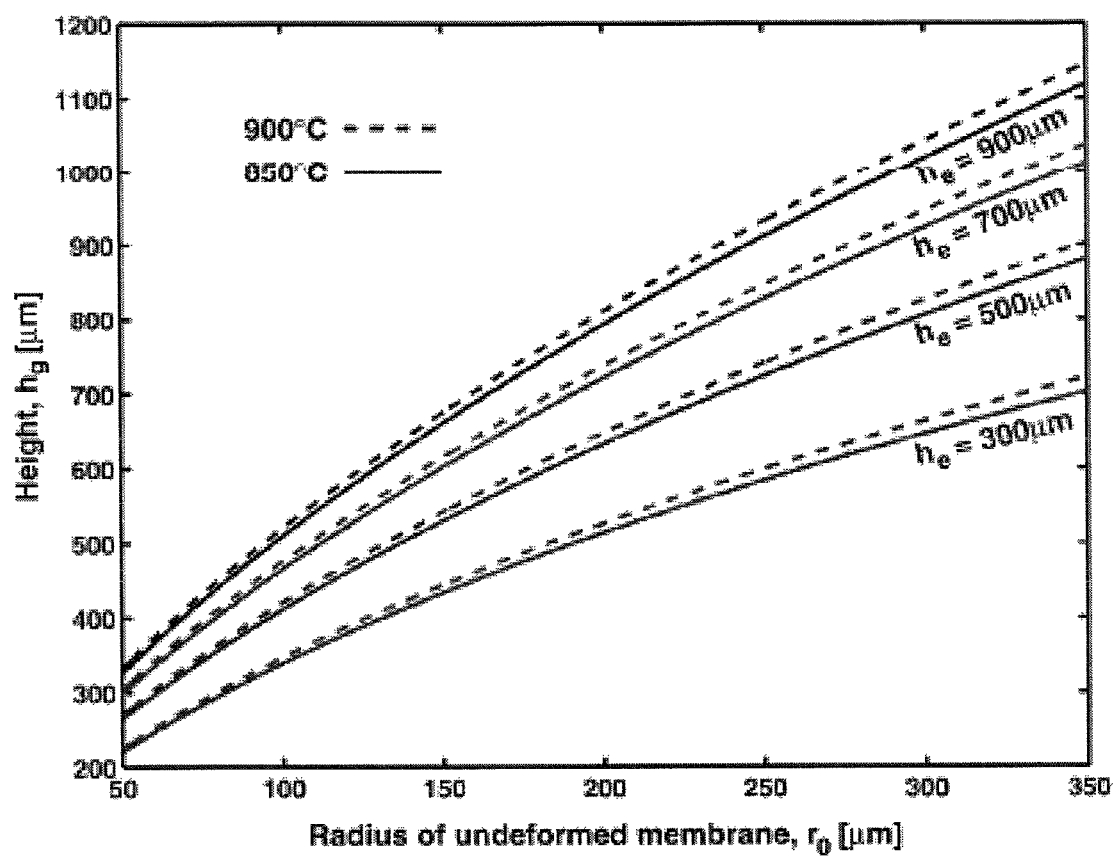
FIG. 5 is a graph of the estimated height of a blown structure or micro-object, as a function of the radius of the undeformed membrane, $r_0$.

By combining Equations (3) and (6), the final height of the semisphere 18 can be shown to develop as a function of the furnace temperature, the temperature at which the cavity 14 was sealed, and the depth and radius of the etched cavity 14 according to a.

$$h_g = \frac{\left[(3V_g + \sqrt{r_0^6 \pi^2 + 9V_g^2})\pi^2\right]^{\frac{2}{3}} - r_0^2 \pi^2}{\pi \left[(3V_g + \sqrt{r_0^6 \pi^2 + 9V_g^2})\pi^2\right]^{\frac{1}{3}}} \quad (7)$$

where $V_g = h_e \pi r_0^2 (T_f/T_s - 1)$ is obtained from Equations (2) and (5). While it is possible to shape glass over a wide range of temperatures, empirical trials show that if the temperature is lower than 800° C. it will take a long time for the glass spheres 18 to develop. Also, if the temperature is higher than 950° C. the spheres 18 tend to break due to the low viscosity at higher temperatures. The best shapes were obtained at temperatures between 850 and 900° C. when using Pyrex 7740 borosilicate glass. The height of the semisphere 18 as a function of the initial radius of the undeformed glass membrane (equal to the radius of the etched cavity) is plotted in FIG. 5 for etch depths of 300, 500, 700, and 900 μm. Plots are shown for both 850° C. (solid) and 900° C. (dashed).

Note that the variation in height due to furnace temperature is relatively small in the region of 850-900° C. The radius of the etched cavity 14 has the largest influence on the final volume of the glass shell 18 due to the square of $r_0$ in Equation (5).

Figure 6:
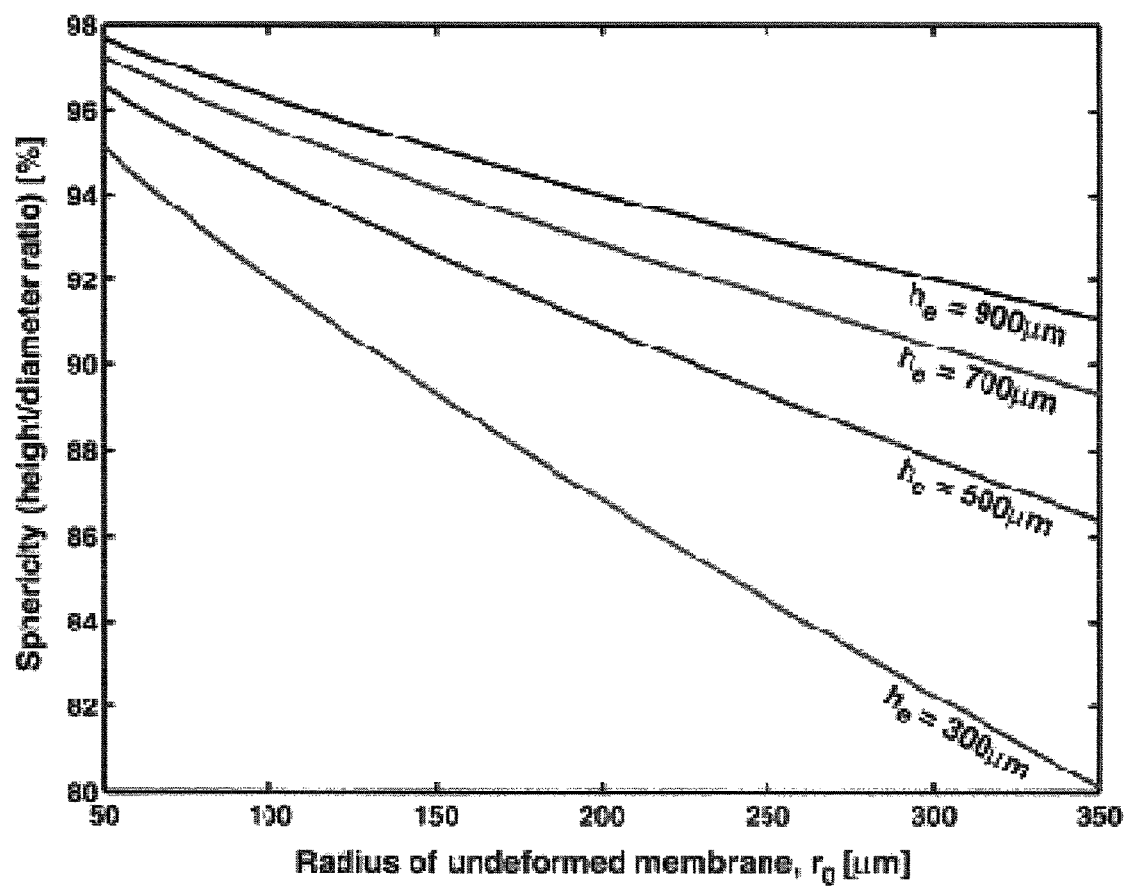
FIG. 6 is a graph of the estimated sphericity of a blown structure or micro-object, i.e., the ratio between the height and the diameter of the hollow semisphere, as a function of the radius of the undeformed membrane, $r_0$.

In certain applications a highly spherical shape is desired. For example in a nuclear magnetic resonance gyroscope, which is the application that the wafer-level glass blowing was initially developed for, a spherical gas confinement chamber reduces the self-magnetization of the confined atoms due to symmetry. Thus, a spherical chamber can potentially improve the performance of the inertial instrument. In order to make the shells as spherical as possible, the base radius at the bottom of the hollow semisphere 18 should be small. Therefore it is advantageous to use thick wafers and etch deep cavities (large $h_e$) instead of increasing the etched radius. The ratio between the height and the diameter of the blown semispheres 18, i.e., the sphericity measured in percent, is shown in the graph of FIG. 6 for different etch depths and as a function of the radius of the undeformed glass membrane.

Naturally a narrower opening, $r_0$, gives a more spherical shape. But even for a fairly large radius of 200 μm the estimated ratio between the height and the diameter of the semisphere 18 is greater than 90%, as long as the etched cavity 14 is deeper than 500 μm, as can be seen in FIG. 6. An alternative process, which potentially allows for larger sphericity, is illustrated in FIG. 7. In this process two silicon wafers 10a and 10b are bonded. The first double-side polished (thin) wafer 10a will define the base of the hollow glass semisphere 18 and is etched all the way though with a small radius microhole 14. In the second wafer 10b a large chamber or enlarged microhole 14' is etched. Once etched, the silicon wafers 10a and 10b are bonded using, for example, a fusion bond process. Next, a thin glass wafer is anodically bonded to wafer 10a and the bonded wafers are then placed inside a furnace in order to blow the glass. In this process the radius of the base of the glass shell 18, $r_0$, can be designed to be much smaller than the radius of the cavity etched in wafer 10b, $r_e$. While it is here assumed that the cavity etched in wafer 10b is cylinder-shaped, only the volume matters and wafer 10b can readily be etched into any desired shape using either wet or dry etching. The final volume enclosed by the glass shell 18 is determined primarily by the volume of the cavity etched in wafer 10b and the sphericity is now independent of the microhole's 14' radius, $r_e$. By utilizing this process, $r_0$ can be made as small as a few microns, which in turn gives a ratio between the height and the diameter of the blown hollow semisphere 18 of close to 100%, and thus potentially an almost perfect sphere.

Consider the axis symmetric inflation of a thin circular membrane. Force equilibrium conditions lead to the following estimation of the pressure difference between the inside and outside of the resulting thin spherical membrane:

$$\Delta P = \frac{2\delta}{r_g} \sigma \quad (8)$$

where $\delta$ is the thickness of the membrane, $r_g$ is the radius of the semisphere, and $\sigma$ is the stress. A few assumptions were made during the derivations of this equation. First, the shell thickness is assumed to be much thinner than the radius of curvature, so stress gradients across the shell 18 can be ignored. Furthermore, the thickness of the inflated membrane is assumed to be uniform. While this is not quite true for the described glass blowing process, the above spherical shell equation can still be used to get an idea of the approximate blow-up time of the glass spheres 18.

As was previously discussed, the properties of the heated glass 16 depend on the temperature. For low temperatures the glass 16 behaves like an elastic solid, but for higher temperatures viscoelastic models are normally used. At very high temperatures glass is modeled as a Newtonian fluid. The stress can be split into a viscoelastic part and a viscous part. The resistance to fast deformations is determined primarily by the viscous response. Now consider the top of the hollow semisphere 18, where the flow is purely elongational due to the biaxial stretching of the membrane. For elongational flows of a Newtonian fluid the stress is given by $\sigma=-3\eta d\epsilon/dt$, where $\eta$ is the viscosity and $d\epsilon/dt$ is the strain rate. The strain is $\epsilon=\ln(\delta/\delta_0)$, and hence the stress can be written as $$\sigma = -3\eta \frac{d}{dt}\left(\ln \frac{\delta}{\delta_0}\right). \tag{9}$$

In order to estimate the time required to shape the glass 16, Equations (8) and (9) are combined. The height of the glass shell, $h_g$, now develops according to $$\Delta P = 24\eta r_0^2 \delta_0 \frac{h_g^2}{(r_0^2 + h_g^2)^3} \frac{dh_g}{dt} \tag{10}$$

where $\Delta P = P_i - P_o$ is the pressure difference between the inside, $P_i$, and outside, $P_o$, of the shell 18. In the fabrication process illustrated in FIGS. 1a-1e, $P_o$ is equal to the furnace pressure (1 atm). The pressure inside the glass shell 18 depends on the furnace temperature as well as the time-dependent height of the semisphere 18. The magnitude of this pressure was derived from the ideal gas law and the geometry considerations above as $$P_i = \frac{P_s \frac{T_f}{T_s}}{1 + \frac{h_g}{6r_0^2 h_e}(h_g^2 + 3r_0^2)} \tag{11}$$

where $P_s$ is the pressure at which the cavities 14 etched in the silicon wafer 10 were sealed by the glass wafer (assumed to be 1 atm). It was also assumed that the glass membrane will not significantly deform until the final temperature has been distributed uniformly throughout the wafer, and thus the ideal gas law can be applied. This assumption was based on the fact that the wafers are small and quickly positioned inside the furnace and should therefore heat fairly uniformly as well as rapidly. While this assumption does not quite hold true in reality, it is sufficient for the rough estimations of the order of magnitude of the blow-up time presented here.

As described by equations (10) and (11), the pressure difference, $\Delta P$, increases rapidly to a few atmospheres when the wafers are placed inside the furnace. As the glass shell 18 grows, the pressure inside the shell 18 will decrease until it is almost equal to the pressure inside the furnace (1 atm). After a sufficient period of time, the pressure difference will be close to zero.

Figure 8:
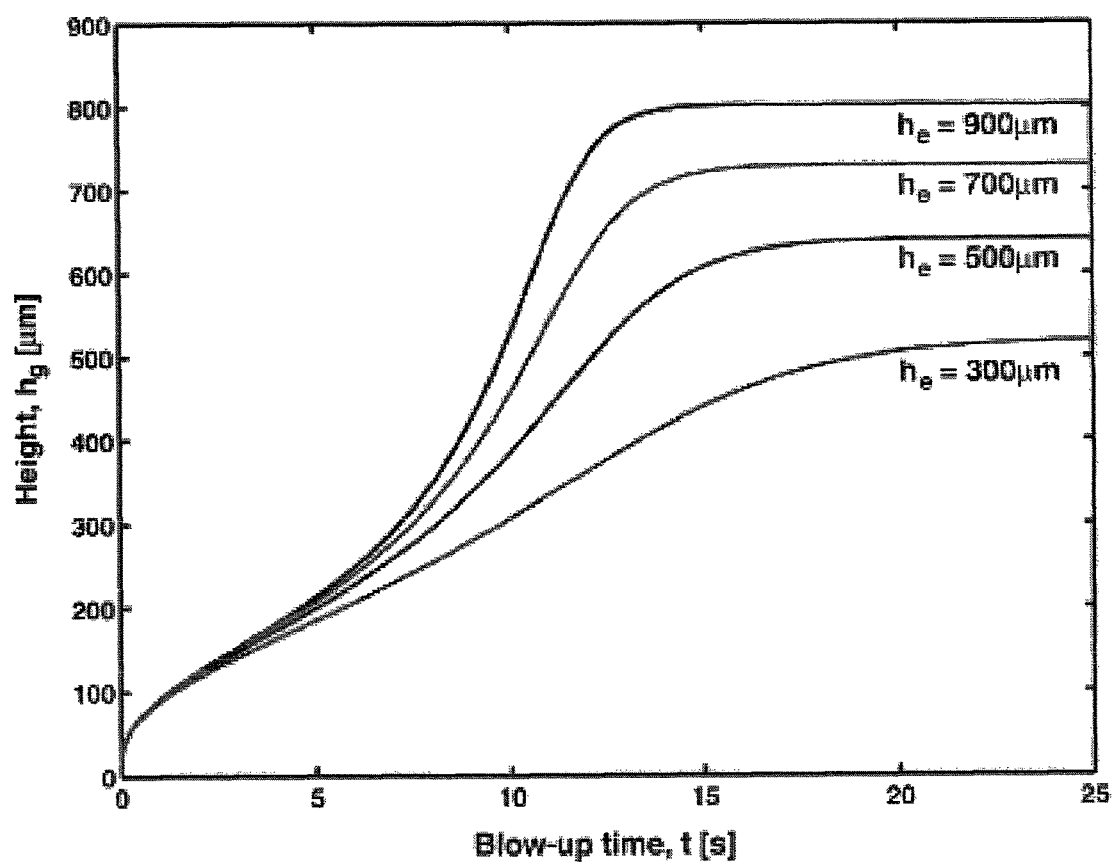
FIG. 8 is a graph of microsphere estimated height verse estimated blow up time required to blow uniformly heated hollow glass semispheres at 850° C.

The plot in FIG. 8 was obtained from equations (10) and (11). The height of the hollow glass semisphere 18 is shown for etch depths of 300, 500, 700, and 900 µm. It was assumed that the etched radius, $r_0$, was 200 µm, the initial glass thickness, $\delta_0$, was 100 µm, and the viscosity of glass, $\eta$, was $10^6$ Pa-s (approximate viscosity of borosilicate glass at 850° C.). The blow-up time is on the order of 15 s. Since a few extra seconds need to be added to allow for the heating of the wafers, the time required to fully form the glass spheres 18 inside a furnace is estimated to be on the order of one minute.

Figure 9:
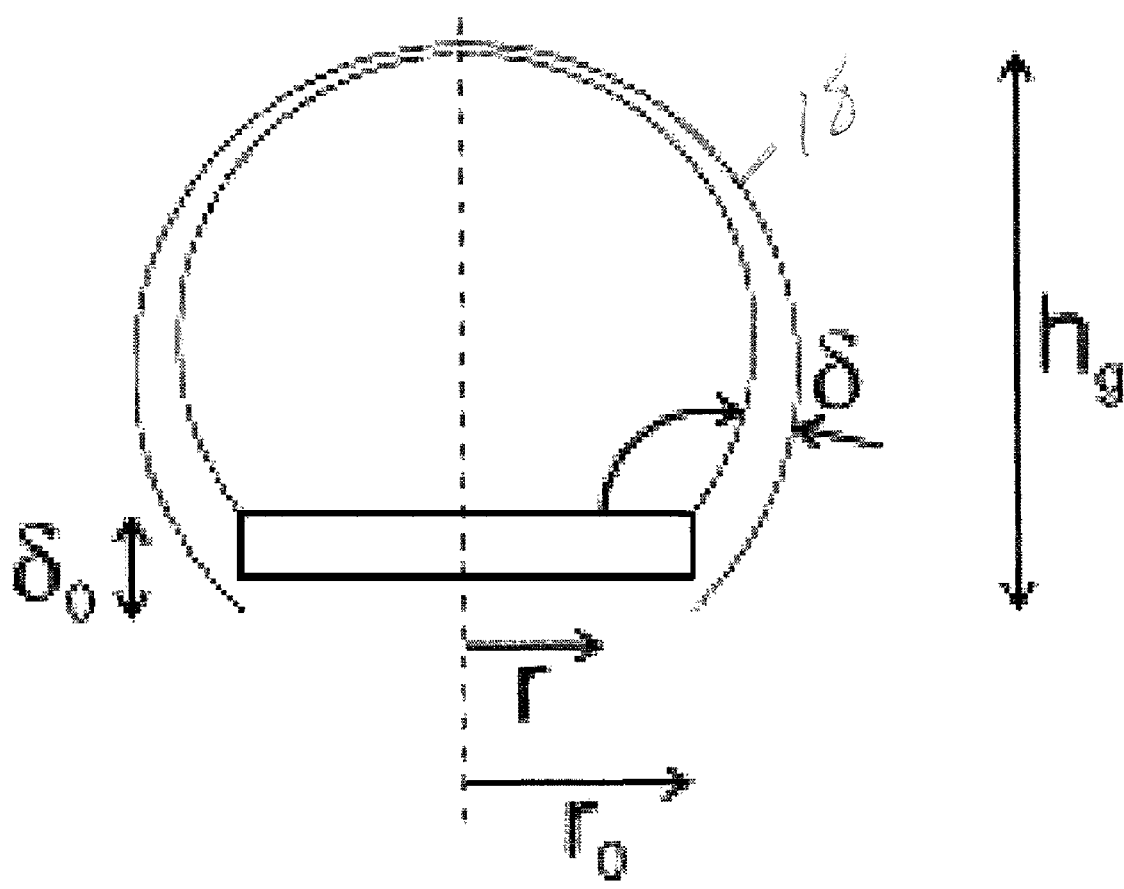
FIG. 9 is a diagram illustrating the variables which parameterize wall thickness thinning in a microsphere.

In the discussion above it was assumed that the thickness of the glass 16 was uniform throughout the surface of the shell 18. However, due to the viscous nature of the heated glass 16 this is not true. The top of the semisphere 18 will be slightly thinner than the parts closer to the base. An estimate of the nonuniform wall thickness of the shell can be derived $$\delta = \delta_0 \left[\frac{r_0^4 + r^2 h_g^2}{r_0^2(r_0^2 + h_g^2)}\right]^2 \tag{12}$$

where a particle that was initially positioned at radius r before the circular membrane was deformed is considered. As the glass 16 is blown and forms a hollow semisphere 18, this particle travels to a new position as shown in FIG. 9. Note that in the middle of the membrane, and thus the thickness of the top of the glass shell 18 is described by. $\delta = \delta_0(1+h_g^2/r_0^2)^{-2}$.

Depending on the particular application of the glass structures, a nonuniform wall thickness may be more or less detrimental. For some applications this property can even be utilized, e.g., to create microlenses. The focal length of a glass shell due to the nonuniform wall thickness can be estimated from the lens makers' equation $$\frac{1}{f} = (n_g - n_0)\left(\frac{1}{R_1} - \frac{1}{R_2}\right) \tag{13}$$

where $R_1$ and $R_2$ are the two different meridional radii of curvature, and $n_g$ and $n_0$ are the refractive indices of the glass and the surrounding medium, respectively.

Consider again an example of an actual fabrication according to the process illustrated in FIGS. 1a-1e. The fabrication was performed using 2-inch diameter single crystal silicon and Pyrex 7740 wafers 10. An array of cylindrical cavities 14 was first etched in the silicon wafer using deep reactive ion etching (DRIE). Structures have been successfully fabricated for etched diameters ranging from 100 to 1000 µm. The targeted depth of the etched cavities 14 varied from 300 to 800 µm.

Once the cavities were etched in the silicon wafer 10, a 100 µm thin Pyrex 7740 sheet 16 was anodically bonded to the silicon wafer 10. The bonding was done at atmospheric pressure on top of a hot plate set to 400° C. and using a voltage of 600 V. Next the wafers 10 were diced using a diamond saw. Optionally the wafer 10 can be diced after the blowing of the glass shells 18 but in order to avoid potential damages to the glass structures the dicing was here performed before the hollow glass semispheres 18 are blown. If the dicing is instead performed as the last fabrication step, some additional care needs to be taken in order to protect the fragile glass shells.

The wafers 10 were placed inside a furnace at a temperature of approximately 850° C. for about 3 minutes in order to shape the glass spheres.

As was previously discussed, an issue that potentially affects the final shape of the shells 18 in the illustrated embodiments the temperature used during the anodic bonding. The final height (and consequently radius) of the glass shells 18 depends on the temperature at which the etched chambers were sealed, $T_s$. Above it has been assumed that is equal to room temperature. However, in order for this assumption to be valid, a sufficient force must be applied to the top electrode until the anodic bonding is completed to provide a temporary seal between the glass 16 and the silicon of wafer 10. If the glass 16 and silicon wafers 10 are not perfectly sealed in this manner at room temperature, some air will escape from the etched cavities 14 when heated during the anodic bonding, leading to a higher and thus a smaller final height of the glass shells 18. The anodic bonding can alternatively be performed inside a pressure chamber. By controlling both the temperature and the pressure during the anodic bonding, the final size of the glass shells 18 can be accurately predicted. Once the hollow glass spheres 18 are fabricated, a few optional fabrication steps may be required depending on the particular application.

For example, if the chambers need to be filled with gas or other substances, it may be necessary to open the backside 20 of the wafer 10. The backside 20 can be patterned and etched using either wet or dry etchants to gain access to the hollow semispheres 18 (assuming the glass shells on the front side are protected). If double-side polished wafers are used, a rim can be maintained on the backside that will allow for resealing of the chamber using anodic bonding techniques.

Other additional processing steps may include applying an anti-relaxation coating, etching of the bulk glass to gain access to the silicon, and integration with other electrical and mechanical components.

Figure 10:
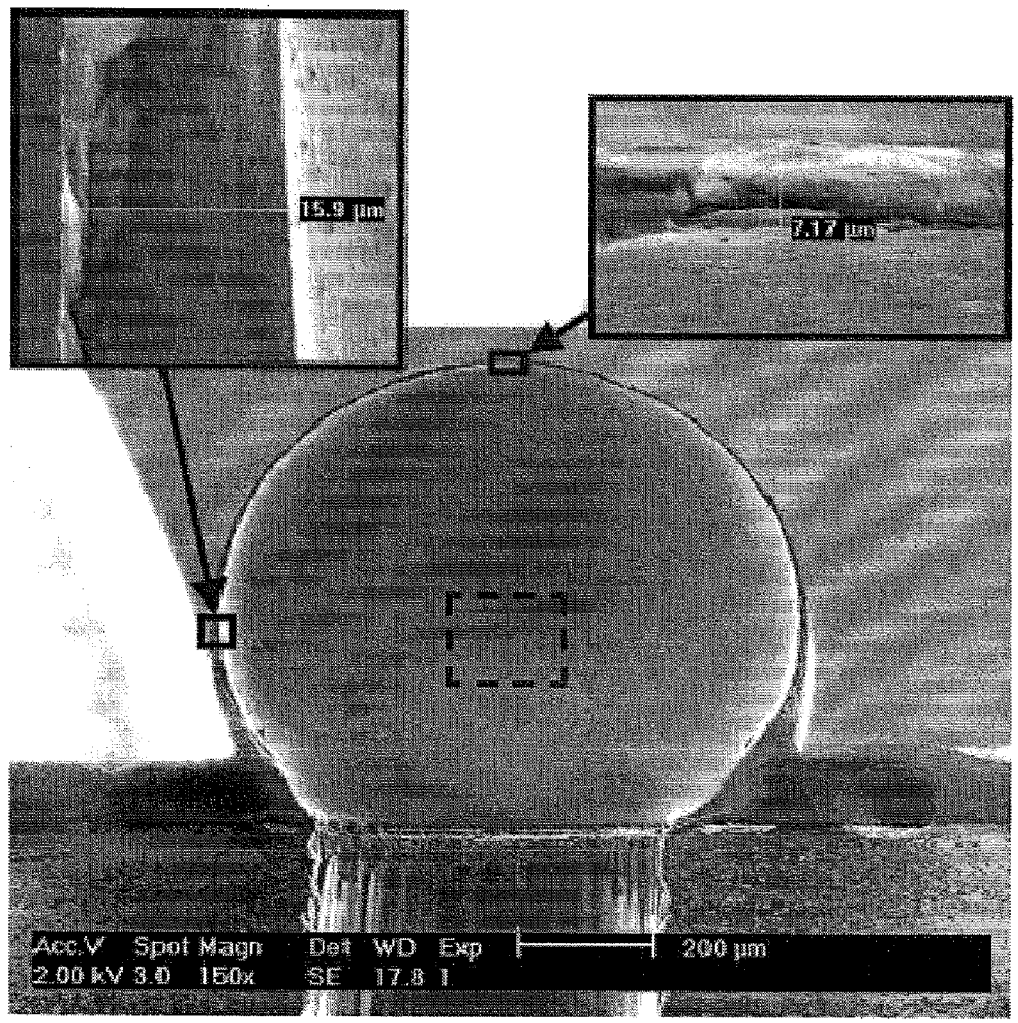
FIG. 10 is a microphotograph of a microsphere fabricated according to the invention with scanning electron microscope insets showing wall thickness and structure in two locations with are included with solid outlined boxes.

The fabricated shells in the example above were covered with photoresist and diced at the center of the spheres 18 in order to be able to perform metrology. A scanning electron microscope image of the cross-section of one of the hollow semispheres is shown in FIG. 10. The shell 18 was fabricated using a 1 mm thick silicon wafer bonded to a 100 μm thin Pyrex 7740 wafer 10, and was formed at 850° C. The cylinder-shaped etched cavity 14 is 750 μm deep and 500 μm in diameter. Table I shows a comparison between the experimental results and the values predicted by the presented analytical model, calculated using the equations above as specified in the table.

surface quality of both the inside and the outside of the side of the glass semisphere 18 (dashed area in FIG. 10) was measured using an optical profiler (Hyphenated-Systems NanoScale 150OP). Although both surfaces were still relatively smooth, the surface roughness was greater on the outside surface. The specified initial surface roughness of the Pyrex 7740 wafers was <10 Å. The average surface roughness after the spheres were formed was 2 nm on the inside surface and 9 nm on the outside. It is believed that the reason for this difference in surface roughness is that the inside surface was subjected to a uniform pressure during the blowing of the spheres, while the outside surface was directly exposed to the surrounding nitrogen gas flow and particulates inside the furnace.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching

TABLE I

COMPARISON BETWEEN THE GlASS BLOWING MODEL AND THE EXPERIMENTAL RESULTS

| Parameter | Equation | Chip 1 ($h_c = 350$ μm, $r_0 = 375$ μm) | | | | Chip 2 ($h_c = 750$ μm, $r_0 = 250$ μm) | | | |
| --- | --- | --- | --- | --- | --- | --- | --- | --- | --- |
| | | Calculated | Sphere 1 | Sphere 2 | Sphere 3 | Calculated | Sphere 4 | Sphere 5 | Sphere 6 |
| Glass height, $h_g$ | (7) | 794 μm | 806 μm | 834 μm | 718 μm | 860 μm | 818 μm | 814 μm | 803 μm |
| Glass radius, $r_g$ | (3) | 486 μm | 520 μm | 540 μm | 479 μm | 466 μm | 431 μm | 439 μm | 436 μm |
| Uniform thickness, δ | (4) | 18 μm | N/A | N/A | N/A | 7.8 μm | N/A | N/A | N/A |
| Thickness at top, δ | (12) | 3.3 μm | 14 μm | 13 μm | 14 μm | 0.6 μm | 5.3 μm | 5.5 μm | 7.2 μm |
| Thickness at side, δ | (12) | 33 μm | 28 μm | 22 μm | 29 μm | 18 μm | 11 μm | 12 μm | 16 μm |

Two different chips from wafer 10 were diced and three glass shells 18 were measured on each chip. Chip 1 was fabricated from a 450 μm thick silicon wafer by etching 350 μm deep cavities with a radius of 375 μm. A 1-mm-thick wafer was instead used to fabricate Chip 2, with an etch depth of 750 μm and a radius of 250 μm. The calculated height and radius agree with the experimental values in Table I. However, both equations (4) and (12) failed to predict the final thickness of the shells 18. While the thickness was not quite uniform, the thickness variation was overestimated using equation (12). Instead the true glass thickness was somewhere in between the thicknesses predicted by the uniform and the nonuniform models.

It should be mentioned that two other variables may have affected the results in Table I. First, while great care was taken to attempt to dice the cross-sections in the middle of the spheres 18, a slight offset from the center was inevitable. Therefore the actual height and radius of the glass spheres 18 may be slightly larger than the values displayed in Table I. In addition, the specified thickness of the Pyrex 7740 wafer was 100 μm±25 μm. This potential variation of 50 μm naturally leads to some discrepancies in the thickness results. The that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for fabricating self-inflated micro-objects on a microscopic level comprising:
   defining a plurality of blind microholes into a wafer;
   disposing a sheet of thermally formable glass onto the wafer covering the microholes to trap a gas in the microholes;
   heating the sheet of thermally formable glass until a predetermined degree of plasticity is achieved;
   applying thermally generated pressure due to expansion of the trapped gas in the microholes to the sheet of thermally formable glass, while the sheet is plastic; and
   simultaneously forming a plurality of blown micro-objects in the sheet on the wafer by means of continued application of thermally generated pressure for a predetermined time,
   wherein each microhole has an opening adjacent to the sheet communicating with an interior of the micro-object when the micro-object is formed, the opening having a cross-sectional area that is smaller than the remaining portions of the microhole at the time the micro-object is formed such that the height and volume of the micro-object can be precisely controlled.

2. The method of claim 1 where defining the blind microholes comprises etching the microholes using deep-reactive ion etching (DRIE).

3. The method of claim 1 where disposing a sheet of thermally formable glass comprises bonding the thermally formable glass to the wafer using anodic bonding to seal the plurality of microholes.

4. The method of claim 3 further comprising thinning the sheet to a predetermined thickness after being bonded to the wafer.

5. The method of claim 1 where disposing a sheet of thermally formable glass comprises bonding glass to the wafer.

6. The method of claim 1 further comprising fabricating integrated electrical and mechanical components on or into the wafer.

7. The method of claim 1 further comprising disposing a gas-source material in a solid state in the micro-objects and heating the gas-source material to produce a vapor inside the micro-objects.

8. The method of claim 1 further comprising disposing a gaseous, liquid, or solid material in the micro-objects.

9. The method of claim 1 where the etched cavities in the wafer are filled with a predetermined substance before the thermally formable glass is bonded to the wafer.

10. The method of claim 1 where the wafer has a backside and further comprising etching the backside, filling the micro-objects with a predetermined substance, and resealing the micro-objects by bonding a layer to the backside of the wafer.

11. The method of claim 1 where simultaneously forming the plurality of blown micro-objects in the sheet on the wafer by means of continued application of pressure for a predetermined time comprises blowmolding the plurality of micro-objects into a mold.

12. The method of claim 1 where simultaneously forming the plurality of blown micro-objects in the sheet on the wafer by means of continued application of pressure for a predetermined time comprises forming a plurality of hollow substantially hemispherical micro-objects.

13. The method of claim 1 where simultaneously forming the plurality of blown micro-objects in the sheet on the wafer by means of continued application of pressure for a predetermined time comprises forming a plurality of hollow substantially spherical micro-objects.

14. The method of claim 1 where simultaneously forming the plurality of blown micro-objects in the sheet on the wafer by means of continued application of pressure for a predetermined time comprises forming a plurality of cylindrical channels.

15. The method of claim 1 where defining the plurality of blind microholes into the wafer further comprises defining an enlarged volume chamber within each blind microhole so that the corresponding micro-object formed by the thermally generated pressure is increased in volume as compared to the micro-object formed by the thermally generated pressure in the corresponding microhole without the enlarged chamber formed therein.

16. The method of claim 1 where the cavities etched in the wafer are sealed in a controlled-pressure environment so that the volume of the micro-objects can be precisely controlled.

17. The method of claim 1 where the thermally formable glass is heated and shaped inside an environment with controlled temperature as well as controlled pressure so that the volume of the micro-objects can be precisely controlled.

18. The method of claim 1 where each microhole has an opening adjacent to the sheet communicating with an interior of the micro-object when the micro-object is formed, the opening having a reduced diameter compared to remaining portions of the microhole such that sphericity of the micro-object formed in the sheet as determined by the ratio of the height of the micro-object to its radius tends toward 1.

19. The method of claim 18 where the reduced diameter opening is of the order of a few microns.

20. The method of claim 18 where the wafer is comprised of two layers bonded together, a top layer having the microholes defined therethrough with the reduced diameter opening and a bottom layer having blind microholes defined therein with a larger diameter than the opening aligned with the microholes in the top layer, and where disposing the sheet of thermally formable glass onto the wafer covering the microholes to trap a gas in the microholes comprises disposing the sheet of thermally formable glass onto the top layer.

* * * * *